(12) United States Patent
Lin et al.

(10) Patent No.: US 11,003,084 B2
(45) Date of Patent: May 11, 2021

(54) METHOD FOR FORMING SEMICONDUCTOR STRUCTURE

(71) Applicant: TAIWAN SEMICONDUCTOR MANUFACTURING CO., LTD., Hsinchu (TW)

(72) Inventors: Li-Yen Lin, Wujie Township, Yilan County (TW); Ching-Yu Chang, Yilang County (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 119 days.

(21) Appl. No.: 16/150,789

(22) Filed: Oct. 3, 2018

(65) Prior Publication Data

US 2019/0137883 A1    May 9, 2019

Related U.S. Application Data

(60) Provisional application No. 62/581,125, filed on Nov. 3, 2017.

(51) Int. Cl.
| | | |
|---|---|---|
| *G03F 7/20* | (2006.01) | |
| *G03F 7/16* | (2006.01) | |
| *H01L 21/311* | (2006.01) | |
| *H01L 21/033* | (2006.01) | |
| *G03F 7/09* | (2006.01) | |
| *G03F 7/039* | (2006.01) | |

(Continued)

(52) U.S. Cl.
CPC ........ *G03F 7/70025* (2013.01); *G03F 7/0045* (2013.01); *G03F 7/0397* (2013.01); *G03F 7/094* (2013.01); *G03F 7/168* (2013.01); *G03F 7/70033* (2013.01); *H01L 21/0273* (2013.01); *H01L 21/0332* (2013.01); *H01L 21/31105* (2013.01); *H01L 21/31144* (2013.01)

(58) Field of Classification Search
CPC .... G03F 7/70025; G03F 7/094; G03F 7/0397; G03F 7/0045; G03F 7/70033; G03F 7/168; H01L 21/0273; H01L 21/31144; H01L 21/31105; H01L 21/0332
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |

(Continued)

*Primary Examiner* — Bilkis Jahan
*Assistant Examiner* — Victor V Barzykin
(74) *Attorney, Agent, or Firm* — Birch, Stewart, Kolasch & Birch, LLP

(57) ABSTRACT

A method for forming a semiconductor device structure is provided. The method includes forming a material layer over a substrate and forming a resist layer over the material layer. The method includes exposing a portion of the resist layer by performing an exposure process. The resist layer includes a compound, and the compound has a carbon backbone, and a photoacid generator (PAG) group and/or a quencher group are bonded to the carbon backbone. The method also includes performing a baking process on the resist layer and etching a portion of the resist layer to form a patterned resist layer. The method includes patterning the material layer by using the patterned resist layer as a mask and removing the patterned resist layer.

20 Claims, 14 Drawing Sheets

(51) Int. Cl.
 *H01L 21/027* (2006.01)
 *G03F 7/004* (2006.01)

(56) References Cited

U.S. PATENT DOCUMENTS

| | | | |
|---|---|---|---|
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2006/0068318 A1* | 3/2006 | Meagley | G03F 7/0392 430/270.1 |
| 2014/0272726 A1* | 9/2014 | Chang | G03F 7/168 430/325 |
| 2016/0284537 A1* | 9/2016 | Liu | G03F 7/0751 |

* cited by examiner

METHOD FOR FORMING SEMICONDUCTOR STRUCTURE

CROSS REFERENCE TO RELATED APPLICATIONS

This Application claims the benefit of U.S. Provisional Application No. 62/581,125 filed on Nov. 3, 2017, and entitled "Resist composition and method for forming semiconductor device structure using resist composition", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
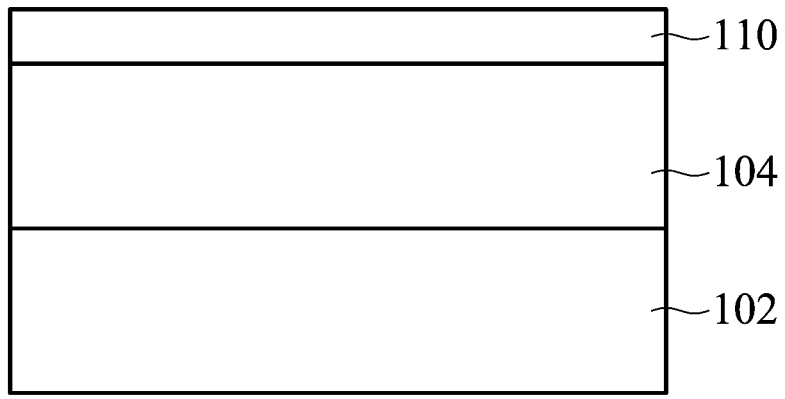
FIGS. 1A-1E show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments for a semiconductor structure and method for forming the same are provided. FIGS. 1A-1E show cross-sectional representations of various stages of forming a semiconductor structure, in accordance with some embodiments of the disclosure. The method can be used in many applications, such as fin-type field effect transistor (FinFET) device structure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium (Ge). In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Afterwards, a material layer 104 is formed over the substrate 102, and the resist layer 110 is formed over the material layer 104, in accordance with some embodiments of the disclosure. The material layer 104 is configured to be patterned or doped in subsequent manufacturing processes. The material layer 104 may include one or more sub-layers made of the same or different materials. In some embodiments, the material layer 104 includes a silicon layer, a dielectric layer, and/or a doped poly-silicon layer. In some embodiments, the material layer 104 or the resist layer 110 is independently formed by a deposition process, such as a spin-on coating process, chemical vapor deposition process (CVD), physical vapor deposition (PVD) process, and/or other suitable deposition processes.

In some embodiments, the resist layer 110 includes a chemically amplified resist (CAR) material. The CAR material is used to improve sensitivity of the resist layer 110. The CAR materials can generate multiple chemical reactions upon exposure to radiation, thereby chemically amplifying a response to the radiation. In some embodiments, the resist layer 110 includes a compound, and the compound has a linker, and at least one of a photoacid generator (PAG) group and a quencher (Q) group bonded to the linker. In some other embodiments, at least one of the photoacid generator (PAG) group and the quencher (Q) group is bonded to a polymer backbone. In addition to the PAG group and/or the quencher (Q) group, an acid labile group (ALG) and a polar unit (PU) are bonded to the polymer.

In some embodiments, the PAG includes a phenyl ring. In some embodiments, the PAG includes halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazine derivatives.

The quencher (Q) is a base type and is capable of neutralizing acid. The quencher may inhibit other active component of the resist layer 110, such as inhibiting the acid generated from PAG. In some embodiments, the quencher includes a nitrogen atom having an unpaired electron capable of neutralizing an acid.

Figure 1B:
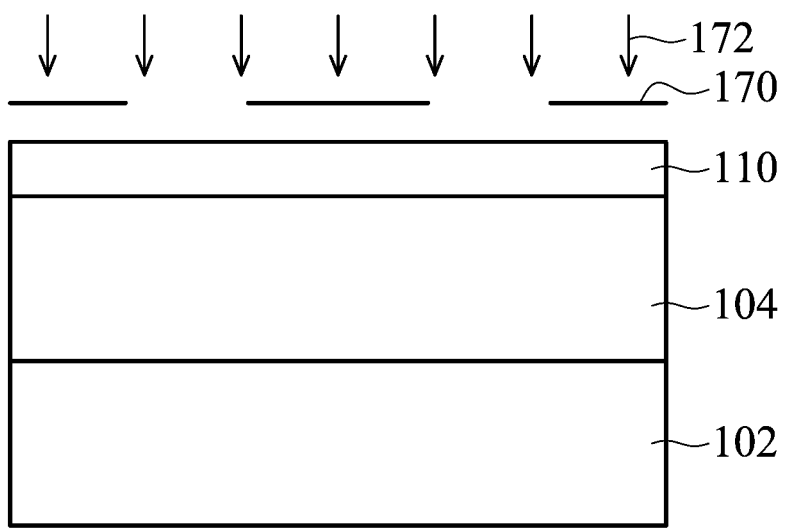

Next, as shown in FIG. 1B, a mask 170 is formed over the resist layer 110, and an exposure process 172 is performed on the resist layer 110 to form an exposed region and an unexposed region, in accordance with some embodiments of the disclosure.

The radiation energy of the exposure process 172 may include a 248 nm beam by Krypton Fluoride (KrF) excimer lasers, a 193 nm beam by Argon Fluoride (ArF) excimer lasers, a 157 nm beam by Fluoride ($F_2$) Excimer Lasers, or Extreme ultra-violet (EUV) light, such as EUV light with wavelength of about 13.5 nm.

After the exposure process 172, a post-exposure-baking (PEB) process is performed. The PAG group in the resist layer 110 generates acid when the resist layer 110 is exposed to the radiation energy and absorbs the radiation. During the PEB process, the acid labile group (ALG) is cleaved when the resist layer 110 in the acidic environment. As a result, the polarity and/or solubility of the exposed region of the resist layer 110 are changed.

In some embodiments, the PEB process includes using a microwave or an IR lamping heating process. In some embodiments, the PEB process is performed at a temperature in a range from about 90 degrees Celsius to about 350 degrees Celsius. In some other embodiments, the PEB process is performed for a period of time in a range from about 500 μs to about 30 seconds. It should be noted that since the microwave or the IR lamping heating process can provide the heat uniformly, the resist layer 110 is baked at a certain temperature uniformly by using the microwave or the IR lamping heating process. The chemical reaction in the resist layer 110 can react quickly by providing heat uniformly. As a result, the heating time of the baking process may be reduced to be shorter than 30 seconds.

Figure 1C:
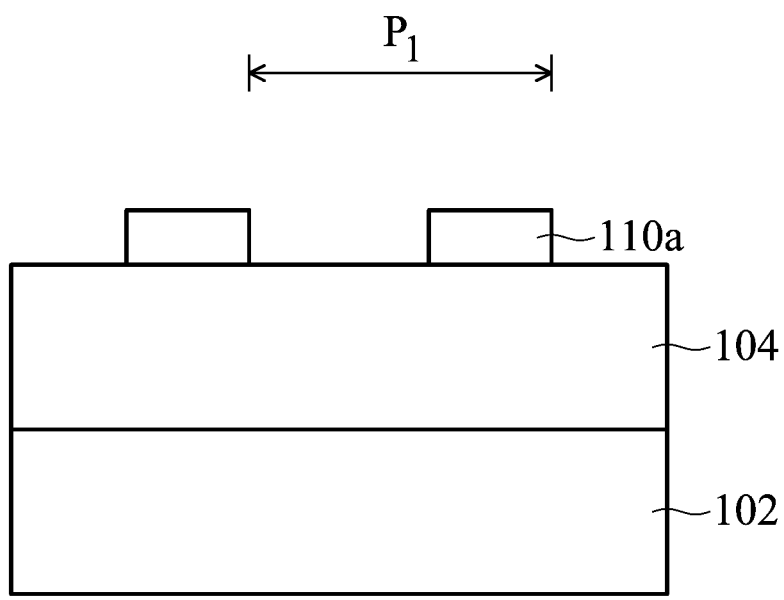

Next, as shown in FIG. 1C, the resist layer 110 is developed by performing a develop process to form a patterned resist layer 110a, in accordance with some embodiments of the disclosure.

There are two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. In some embodiments, the PTD developers are aqueous base developers, such as tetraalkylammonium hydroxide (TMAH). In some embodiments, the NTD developers are organic-based developers, such as n-butyl acetate (n-BA), iso-amyl acetate(IAA) or other solvent that can dissolve unexposed portions of the resist layer. As shown in FIG. 1C, in some embodiments, the negative tone developer (NTD) process is performed, the exposed region of the resist layer 110 remains, and the unexposed region of the resist layer 110 is removed by the developer.

The exposed region of the resist layer 110 has a number of protruding structures. In some embodiments, there is a pitch $P_1$ which is a distance between the right sidewall surface of the first protruding structure and the right sidewall surface of the second protruding structure.

Figure 1D:
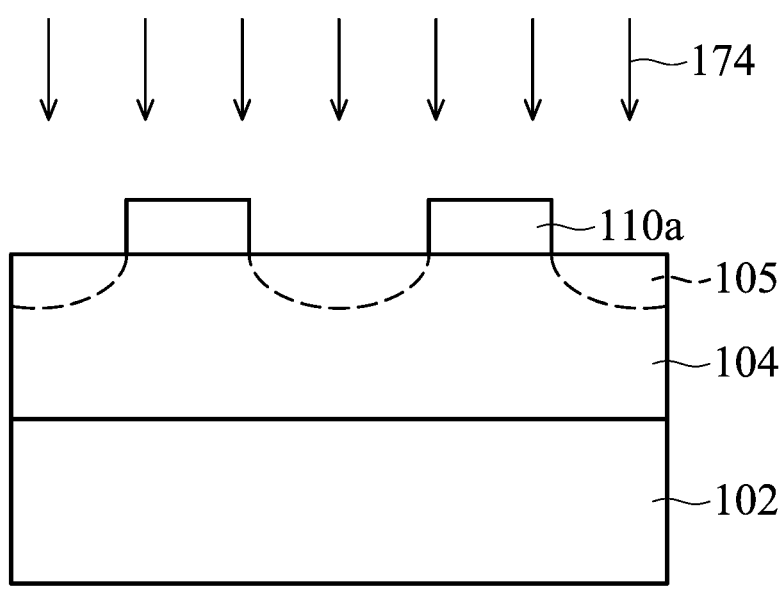

Afterwards, as shown in FIG. 1D, a portion of the material layer 104 is doped by performing an ion implantation process 174 and using the patterned resist layer 110a as a mask, in accordance with some embodiments of the disclosure. As a result, a doped region 105 is formed in the material layer 104. The doped region 105 may be doped with p-type dopants, such as boron or $BF_2$, and/or n-type dopants, such as phosphorus (P) or arsenic (As).

In some other embodiments, the material layer 104 is patterned. A portion of the material layer 104 is removed by performing an etching process and using the patterned resist layer 110a as a mask. In some embodiments, the portion of the material layer 104 is removed by the wet etching process including a base solution, and the base solution is tetraalkylammonium hydroxide (TMAH).

Figure 1E:
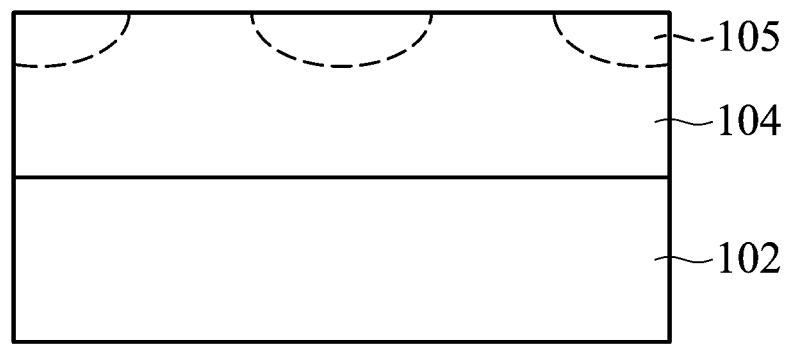

Next, as shown in FIG. 1E, the patterned resist layer 110a is removed by an etching process, in accordance with some embodiments of the disclosure. The etching process includes a number of etching processes. The etching process may be a dry etching process or a wet etching process.

In some embodiments, the resist layer 110 includes a polymer, a photo-acid generator (PAG), a quencher (Q) and a solvent. If the PAG and the quencher (Q) are distributed in the solvent, rather than bonding to the linker or the polymer, when the resist layer 110 is exposed to radiation (e.g. light) the PAG forms a small amount of acid. The acid functions as a catalyst for causing chemical reactions that decrease (or increase) solubility of exposed regions of the resist layer 110.

After the exposing process, the post-exposure-baking (PEB) process is followed. During the PEB process, the acid or the base may be evaporated or sublimated since the PAG and quencher are small molecules. However, the acid generated from PAG or base generated from the quencher in gas form will re-deposit on the exposed region. As a result, the line width of the patterns of the resist layer 110 may be changed. In other words, the re-deposition of the acid or the base may decrease the resolution and/or the dimensional control of the patterns of the resist layer 110. This re-deposition phenomenon is also called "chemical flare".

It should be noted that, in order to resolve the chemical flare issue, in some embodiments, the resist layer 110 includes a compound, and the compound includes a carbon backbone, and the PAG group and the quencher group chemically bonded to the carbon backbone. In some other embodiments, the resist layer 110 includes a first polymer with a first polymer backbone, and the PAG group and/or the quencher (Q) group chemically bonded to the first polymer backbone. The acid generated from the PAG group and/or base generated from quencher (Q) group is not easily evaporated or sublimated since the molecular weight of the first polymer is increased.

Figure 2:
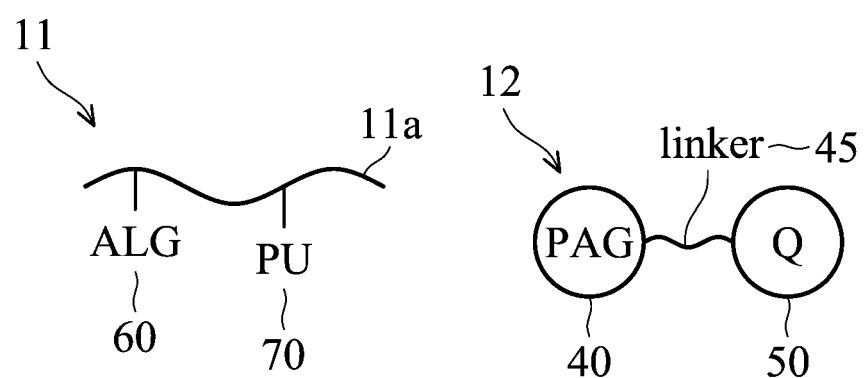
FIG. 2 shows a diagrammatical view of a chemical structure of the resist layer, in accordance with some embodiments.

FIG. 2 shows a diagrammatical view of a chemical structure of the resist layer 110, in accordance with some embodiments. As shown in FIG. 2, the resist layer 110 includes a first polymer 11, a compound 12, and a solvent. The compound 12 includes a linker 45, and the PAG group 40 and the quencher (Q) group 50 are bonded to the linker 45.

The first polymer 11 includes a first polymer backbone 11a, and an acid labile group (ALG) 60 and a polar unit (PU) 70 are bonded to the first polymer backbone 11a. The PAG group 40 generates acid when the resist layer 110 is exposed to the radiation energy and absorbs the radiation. The acid labile group (ALG) 60 cleaves from the first polymer 11 when the resist layer 110 is in the acidic environment. In other words, the PAG group 40 catalyzes cleaving of ALG 60 from the first polymer 11 when the resist layer 110 is exposed to radiation. As a result, the polarity and/or solubility of the exposed region of the resist layer 110 are changed. The PU 70 functions as a protection group which is used to adjust the polarity, radiation absorption efficiency, the etching resistance, or glass transition temperature (Tg) of the resist layer 110.

Since the PAG group 40 and the quencher (Q) group 50 are bonded together by the linker 45, the acid generated from PAG group 40 and the base generated from quencher (Q) group 50 are not easily evaporated or sublimated. Therefore, the evaporation or the sublimation of the acid and base is decreased to prevent the chemical flare phenomenon.

In some embodiments, the solvent includes propylene glycol methyl ether acetate, propylene glycol monomethyl ether, gamma-butyrolactone, ethyl lactate, cyclohexanone, n-butyl acetate, iso-amyl acetate, ethyl ketone, dimethyl formamide, alcohol (e.g., isopropyl alcohol or ethanol), or other suitable solvent.

Figure 3A:
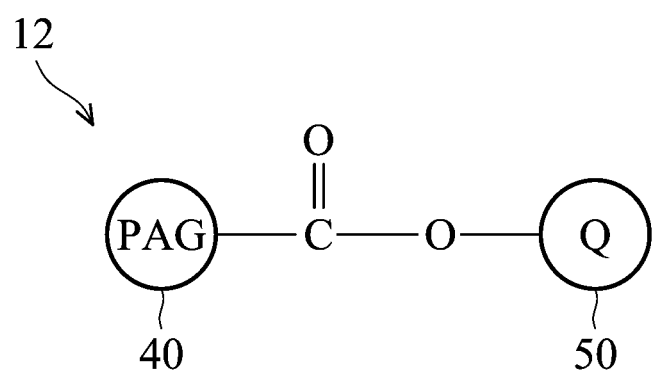
FIGS. 3A-3B shows various diagrammatical views of a chemical structure of the resist layer, in accordance with some embodiments.
Figure 3B:
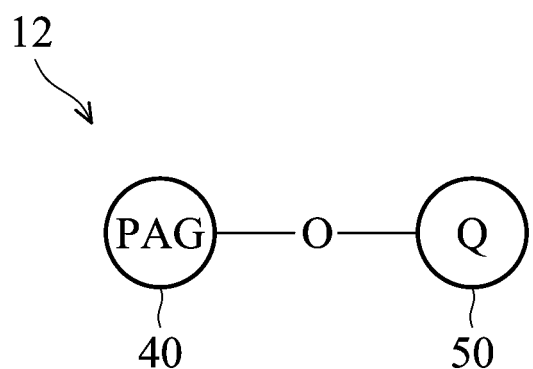

FIGS. 3A-3B shows various diagrammatical views of a chemical structure of the resist layer 110, in accordance with some embodiments. FIGS. 3A-3B are various examples of the linker 45 of the FIG. 2, in accordance with some embodiments.

As shown in FIG. 3A, the linker is carboxylic acid group, and the PAG group 40 and the quencher (Q) group 50 are bonded to the carboxylic acid group. Alternatively, the carboxylic acid group may be replaced by a sulfonic acid group or another acid functional group.

As shown in FIG. 3B, the linker is an ether group, and the PAG group 40 and the quencher (Q) group 50 are bonded to the ether group.

It should be noted that since the PAG group 40 and the quencher (Q) group 50 bonded to the linker 45, the molecular weight of the compound 12 is increased. When the PEB process is performed on the resist layer 110, the evaporation or the sublimation of the acid and base is decreased to prevent the re-deposition of the acid and/or the base on the adjacent patterns. As mentioned above, the acid is generated from PAG group 40, and the base is generated from quencher (Q) group 50. Accordingly, the critical dimensional (CD) control of the patterns of the patterned resist layer 110a is improved.

After the PEB process, the loss of the solid content of the resist layer 110 can be reduced by bonding the PAG group 40 and the quencher (Q) group 50 to the linker 45. The "solid content" is the amount of solids present in the resist layer 110. In some embodiments, the loss of the solid content of PAG group 40 or quencher (Q) group 50 in the resist layer 110 is in a range from about 0.1% to about 10% after the PEB process is performed on the resist layer 110.

FIGS. 4A-4E show various diagrammatical views of a chemical structure of the resist layer 110, in accordance with some embodiments.

Figure 4A:
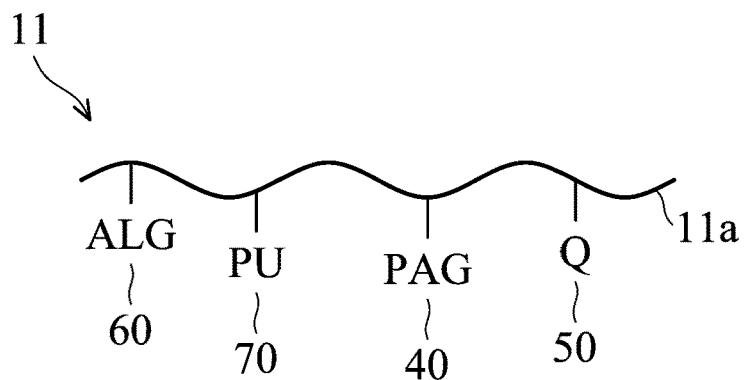
FIGS. 4A-4E show various diagrammatical views of a chemical structure of the resist layer, in accordance with some embodiments.

As shown in FIG. 4A, the resist layer 110 includes a first polymer 11 and a solvent. The first polymer 11 has a first polymer backbone 11a, and the photoacid generator (PAG) group 40 and quencher (Q) group 50 are bonded to the first polymer backbone 11a. In addition to the PAG group 40 and the quencher group 50, the acid labile group (ALG) 60 and the polar unit (PU) 70 are bonded to the same first polymer backbone 11a.

In some embodiments, the average molecular weight of the first polymer 11 is in a range from about 300 to about 15000. Since the PAG group 40 and the quencher (Q) group 50 are bonded to the first polymer 11, the acid generated from PAG group 40 and the base generated from quencher (Q) group 50 are not easily evaporated or sublimated.

Figure 4B:
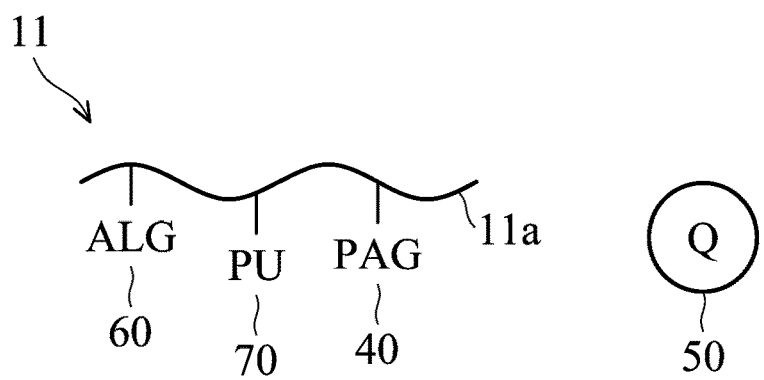

As shown in FIG. 4B, the resist layer 110 includes a first polymer 11, a quencher (Q) 50 and a solvent. The quencher (Q) 50 is dissolved and distributed in the solvent, but is not to bond to any linker or polymer. The first polymer 11 has a first polymer backbone 11a, and the photoacid generator (PAG) group 40, the acid labile group (ALG) 60 and the polar unit (PU) 70 are bonded to the first polymer backbone 11a. In some embodiments, when too much acid is evaporated and diffused to the adjacent patterns, the patterns of the exposed region of the resist layer 110 are over-etched. As a result, the resist pattern 110a as shown in FIG. 1C will be greater than the expected size. In order to prevent the chemical flare phenomenon, the PAG group 40 is bonded to the first polymer backbone 11a to reduce the evaporation or sublimation of the acid generated from PAG group 40.

Figure 4C:
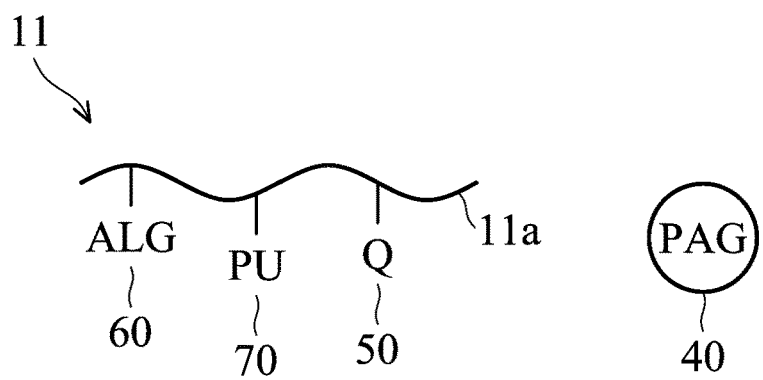

As shown in FIG. 4C, the resist layer 110 includes a first polymer 11, the PAG group 40 and a solvent. The PAG group 40 is dissolved and distributed in the solvent, but is not to bond to any linker or polymer. The first polymer 11 has a first polymer backbone 11a, and the quencher (Q) group 50, the acid labile group (ALG) 60 and the polar unit (PU) 70 are bonded to the first polymer backbone 11a. In some embodiments, when too much base is evaporated and diffused to the adjacent patterns, the patterns of the exposed regions of the resist layer 110 are less etched. As a result, the resist pattern 110a as shown in FIG. 1 C will be smaller than the expected size. In order to prevent the chemical flare phenomenon, the quencher (Q) group 50 is bonded to the first polymer backbone 11a to reduce the evaporation or sublimation of the base generated from the quencher (Q) group 50.

Figure 4D:
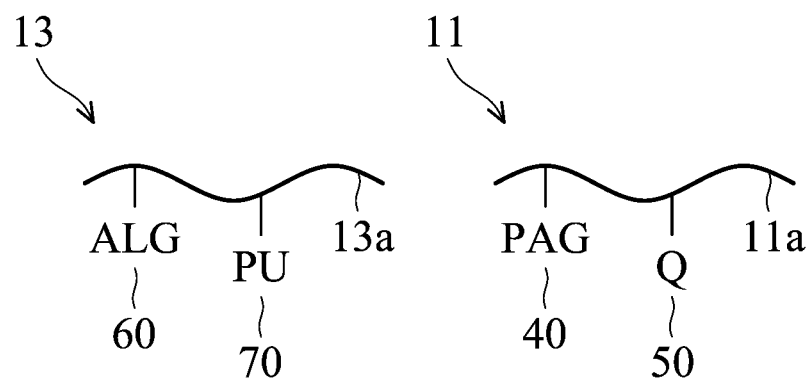

As shown in FIG. 4D, the resist layer 110 includes the first polymer 11, a second polymer 13 and the solvent. The first polymer 11 has a first polymer backbone 11a, and the photoacid generator (PAG) group 40 and quencher (Q) group 50 are bonded to the first polymer backbone 11a. The second polymer 13 has a second polymer backbone 13a, and the acid labile group (ALG) 60 and the polar unit (PU) 70 are bonded to the second polymer backbone 13a.

Figure 4E:
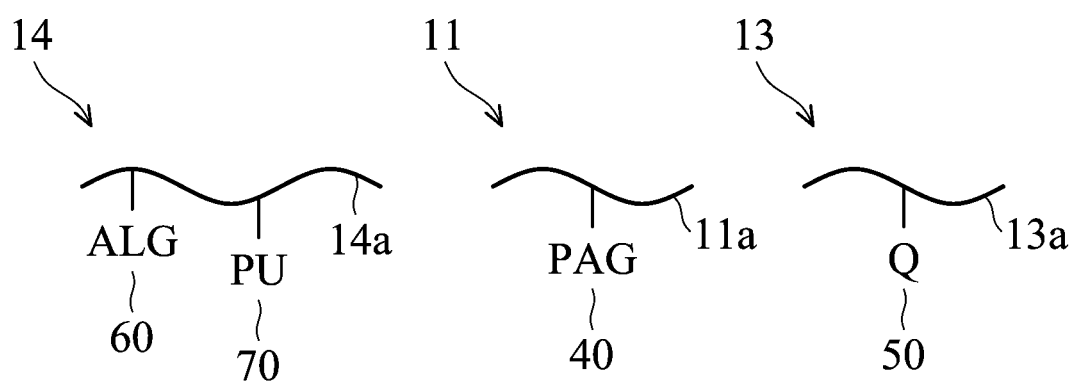

As shown in FIG. 4E, the resist layer 110 includes the first polymer 11, a second polymer 13, a third polymer 14 and a solvent. The first polymer 11 has a first polymer backbone 11a, and the photoacid generator (PAG) group 40 is bonded to the first polymer backbone 11a. The second polymer 13 has a second polymer backbone 13a, and the quencher (Q) group 50 is bonded to the second polymer backbone 13a. The third polymer 14 has a third polymer backbone 14a, and the acid labile group (ALG) 60 and the polar unit (PU) 70 are bonded to the third polymer backbone 14a.

After the PEB process, the loss of the solid content of the resist layer 110 can be reduced by bonding the PAG group 40 and the quencher (Q) group 50 to the first polymer backbone 11a. In some embodiments, the loss of the solid content of the PAG group 40 or the quencher (Q) group 50 of the resist layer 110 is in a range from about 0.1% to about 10% after the PEB process is performed on the resist layer 110.

FIGS. 5A-5E show various diagrammatical views of a chemical structure of the resist layer 110, in accordance with some embodiments. FIGS. 5A-5E are various examples of FIGS. 4A-4E, in accordance with some embodiments.

Figure 5A:
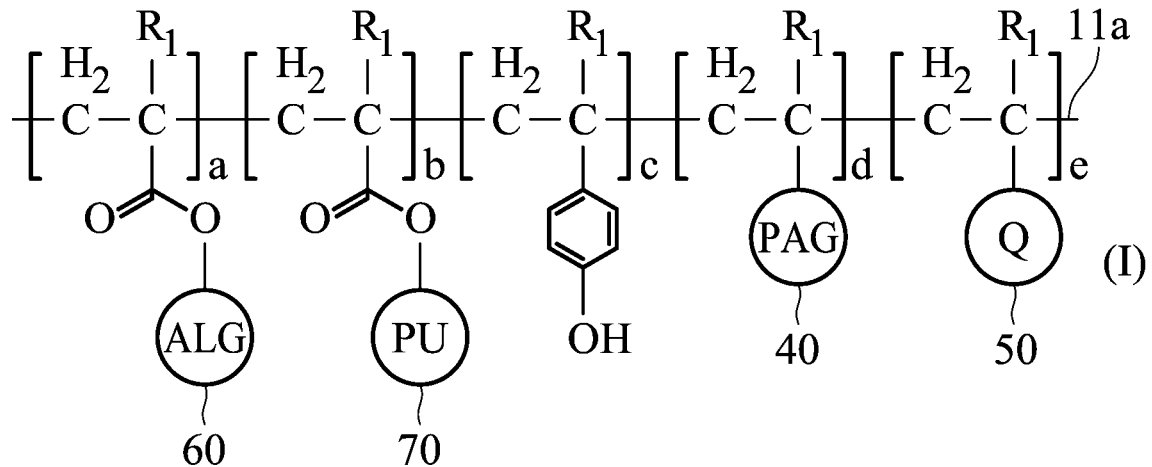
FIGS. 5A-5E show various diagrammatical views of a chemical structure of the resist layer, in accordance with some embodiments.

As shown in FIG. 5A, the first polymer 11 has the formula (I). The first polymer backbone 11a has a carbon backbone and a number of side chains bonded to the carbon backbone. More specifically, the carbon backbone is a liner carbon backbone. In the formula (I), ALG represents an acid-labile group (ALG) group 60, PU represents a polar unit (PU) 70, PAG represents photoacid generator (PAG) group 40, and Q represents quencher (Q) group 50. The ALG 60, the polar unit (PU) 70, the PAG group 40 and the quencher (Q) group 50 are located at the side-chain of the linear carbon backbone. In the formula (I), $R_1$ is hydrogen or methyl ($CH_3$). Each a, b, c, d, e independently represents a mole ratio of each monomer unit, and a+b+c+d+e=1, a, d or e is independently in a range from 0.01 to 0.6, b, c is independently smaller than or equal to 0.3, and b or c can be omitted in some embodiments. In some other embodiments, b or c is independently in a range from 0.01 to 0.3.

It should be noted that in some embodiments, c in formula (I) is greater than zero. The phenyl group at c position of the first polymer backbone 11a functions as a sensitizer to increase the sensitivity of the resist layer 110. More specifically, the phenyl group at side chain of the first polymer backbone 11a of the first polymer 11 is used to improve the sensitivity and the efficiency of the resist layer 110, when the Extreme ultra-violet (EUV) light is used in the exposure process 172 as shown in FIG. 1B. In some other embodiments, when the Argon Fluoride (ArF) excimer laser is used in the exposure process 172 as shown in FIG. 1B, c in formula (I) is zero.

Figure 5B:
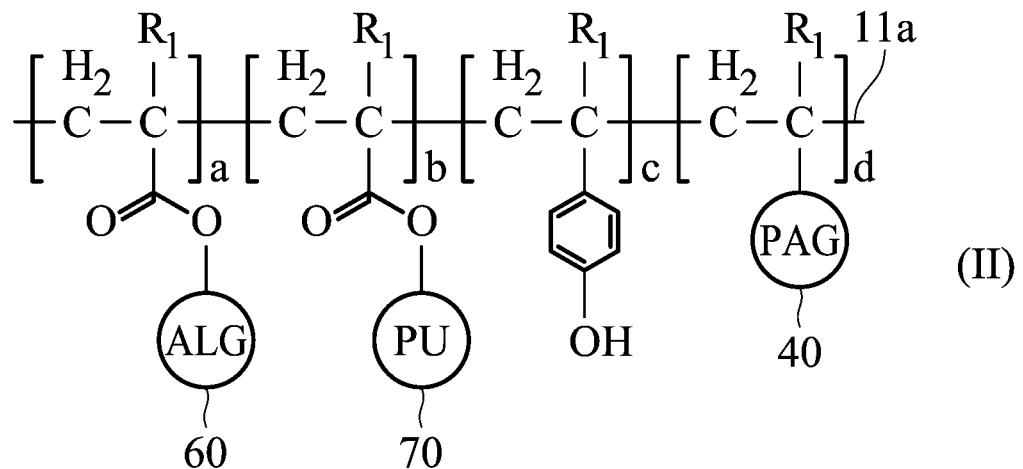

As shown in FIG. 5B, the first polymer 11 has the formula (II). The first polymer backbone 11a has a carbon backbone and a number of side chains bonded to the carbon backbone. In the formula (II), the PAG group 40, the ALG 60 and the PU 70 are bonded to the liner carbon backbone. In the formula (II), $R_1$ is hydrogen or methyl ($CH_3$). Each a, b, c, d independently represents a mole ratio of each monomer unit, and a+b+c+d=1, a or d is independently in a range from 0.01 to 0.6, b or c is independently smaller than or equal to 0.3, and b or c can be omitted in some embodiments. In some other embodiments, b or c is independently in a range from 0.01 to 0.3.

Figure 5C:
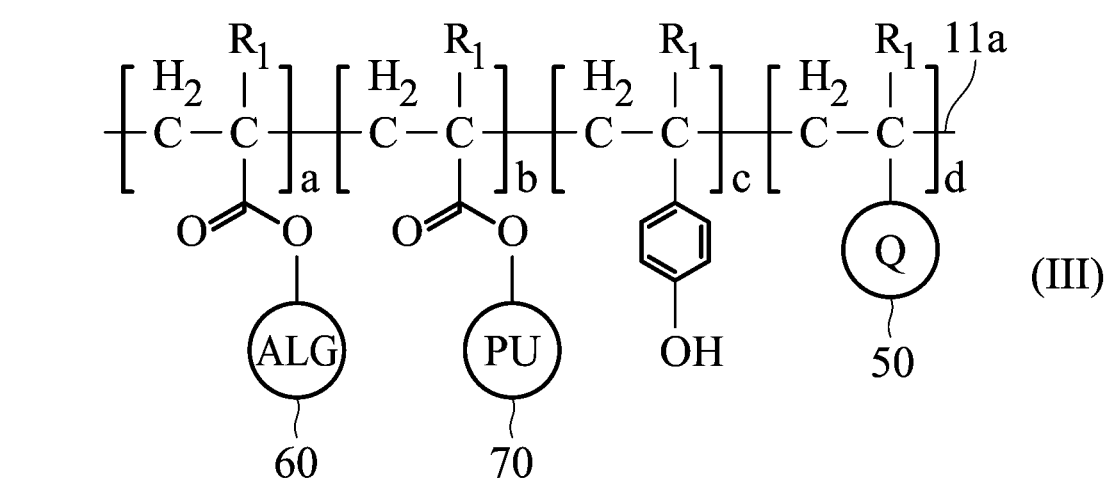

As shown in FIG. 5C, the first polymer 11 has the formula (III). The first polymer backbone 11a has a carbon backbone and a number of side chains bonded to the carbon backbone. In the formula (III), the quencher (Q) group 50, the ALG 60 and the PU 70 are bonded to the liner carbon backbone. In the formula (III), $R_1$ is hydrogen or methyl ($CH_3$). Each a, b, c, d independently represents a mole ratio of each monomer unit, and a+b+c+d=1, a or d is independently in a range from about 0.01 to about 0.6, b or c is independently smaller than or equal to 0.3, and b or c can be omitted in some embodiments. In some other embodiments, b or c is independently in a range from 0.01 to 0.3.

Figure 5D:
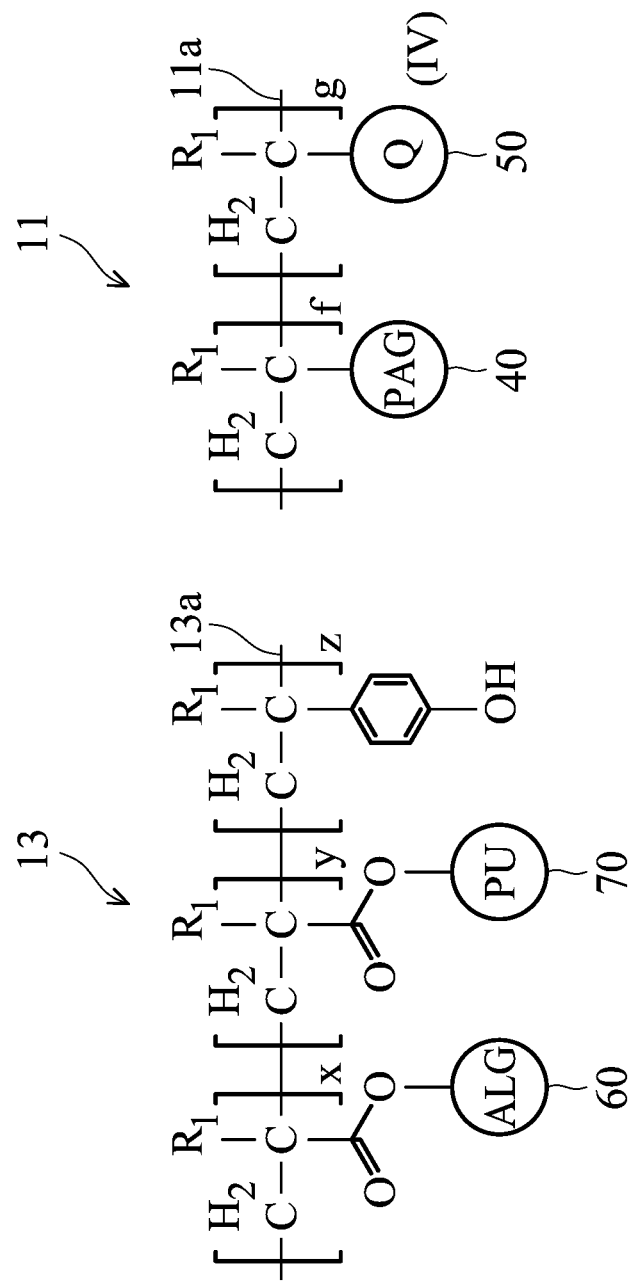

As shown in FIG. 5D, the resist layer 110 includes the first polymer 11 having the formula (IV) and the second polymer 13. The PAG group 40 and the quencher (Q) group 50 are bonded to the first polymer backbone 11a. The second polymer 13 includes a second polymer backbone 13a, and the ALG 60 and the PU 70 are bonded to the second polymer backbone 13a. Each x, y and z independently represents a mole ratio of each monomer unit, and x+y+z=1, x, y or z is independently in a range from 0.1 to 0.6. Each f and g independently represents a mole ratio of each monomer unit, and f+g=1, for g is independently in a range from 0.1 to 0.9.

Figure 5E:
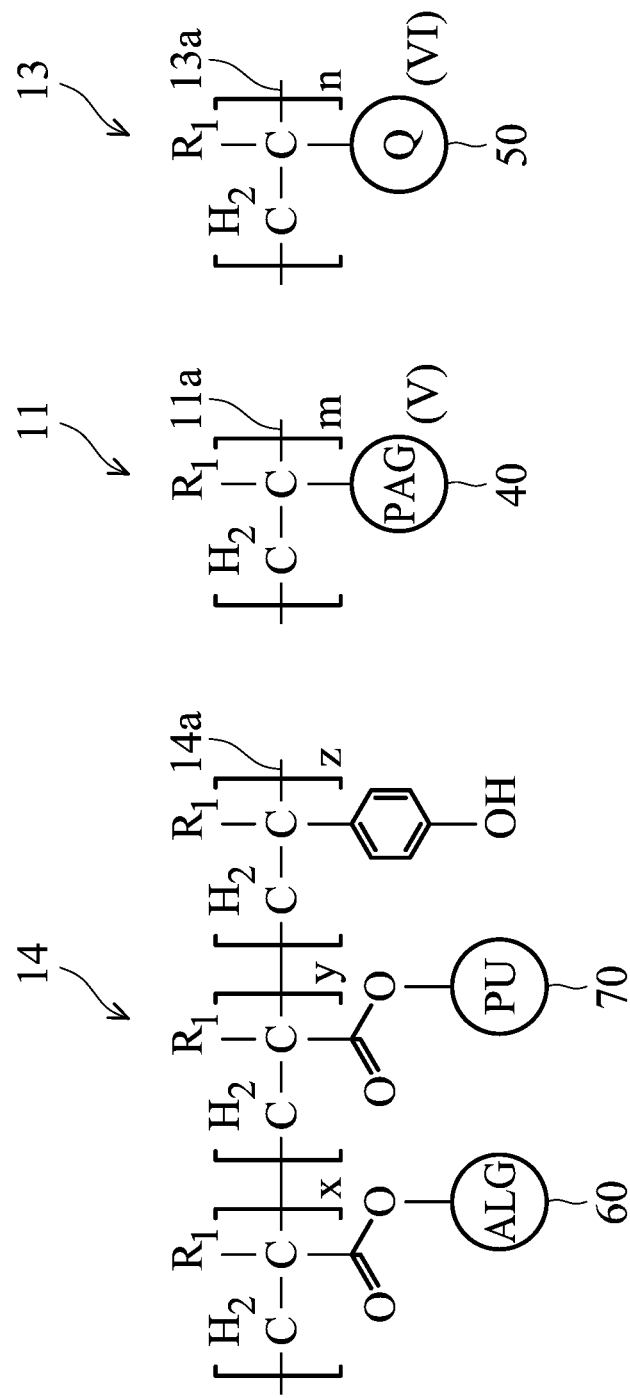

As shown in FIG. 5E, the resist layer 110 includes the first polymer 11 having the formula (V), the second polymer 13 having the formula (VI) and the third polymer 14. The third polymer 14 includes a third polymer backbone 14a, and the ALG 60 and the PU 70 are bonded to the third polymer backbone 14a. The first polymer 11 has the formula (V), and the second polymer has a formula (VI). Each x, y and z independently represents a mole ratio of each monomer unit, and x+y+z=1, y or z is independently smaller than 0.6, y and z can be omitted in some embodiments. In some other embodiments, y or z is independently in a range from 0.01-0.6. Each m and n independently represents an integer, m is in a range from 1 to 5, and n is in a range from 1 to 5.

In some embodiments, the photoacid generator (PAG) group 40 in FIGS. 2, 3A-3B, 4A-4E and 5A-5E includes formula (VII), (VIII), (IX) or (X). $R_2$ is hydrogen (H), fluorine (F), trifluoromethyl ($CF_3$), methyl ($CH_3$), methoxy, ethyl, ethoxy, propyl, propoxy, isopropyl, butyl, butoxy, t-butyl, pentyl, cyclopentyl, hexyl, or cyclohexyl, and f represents an integer. In some embodiments, f is in a range from 1 to about 10.

(VII)

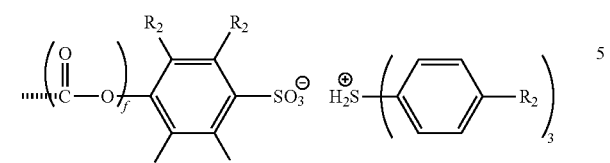

(VIII)

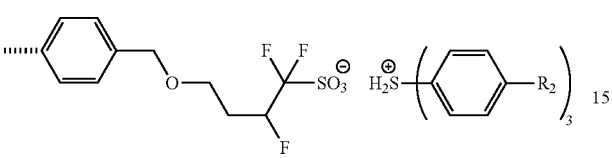

(IX)

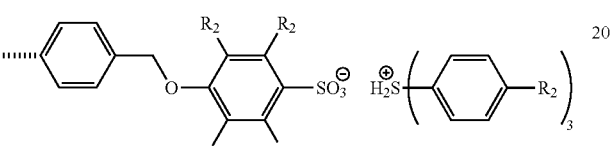

(X)

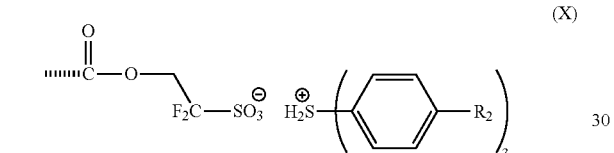

In some embodiments, the quencher (Q) group 50 in FIGS. 2, 3A-3B, 4A-4E and 5A-5E includes formula (XI), (XII), (XIII), (XIV), (XV) or (XVI). $R_2$ is hydrogen (H), fluorine (F), trifluoromethyl ($CF_3$), methyl ($CH_3$), methoxy, ethyl, ethoxy, propyl, propoxy, isopropyl, butyl, butoxy, t-butyl, pentyl, cyclopentyl, hexyl, or cyclohexyl.

(XI)

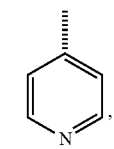

(XII)

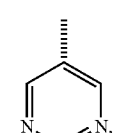

(XIII)

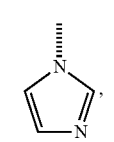

(XIV)

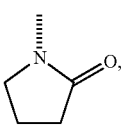

(XV)

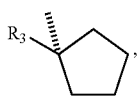

(XVI)

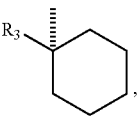

In some embodiments, the acid labile group (ALG) 60 in FIGS. 2, 3A-3B, 4A-4E and 5A-5E includes formula (XVII), (XVIII), (XIX), (XX), (XXI) or (XXII). $R_3$ is methyl, ethyl, propyl, isopropyl, butyl, t-butyl, pentyl, cyclopentyl, hexyl, or cyclohexyl.

(XVII)

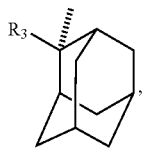

(XVIII)

(XIX)

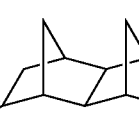

(XX)

(XXI)

(XXII)

In some embodiments, the polar unit (PU) 70 in FIGS. 2, 3A-3B, 4A-4E and 5A-5E includes formula (XXIII), (XXIV), (XXV), (XXVI), (XXVII) or (XXVIII), (XXIX), (XXX) or (XXXI).

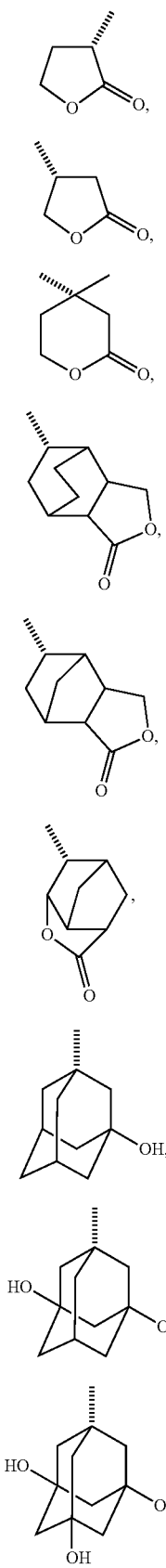

(XXIII), (XXIV), (XXV), (XXVI), (XXVII), (XXVIII), (XXIX), (XXX), (XXXI)

In some embodiments, the first polymer 11 has the formula (XXXII).

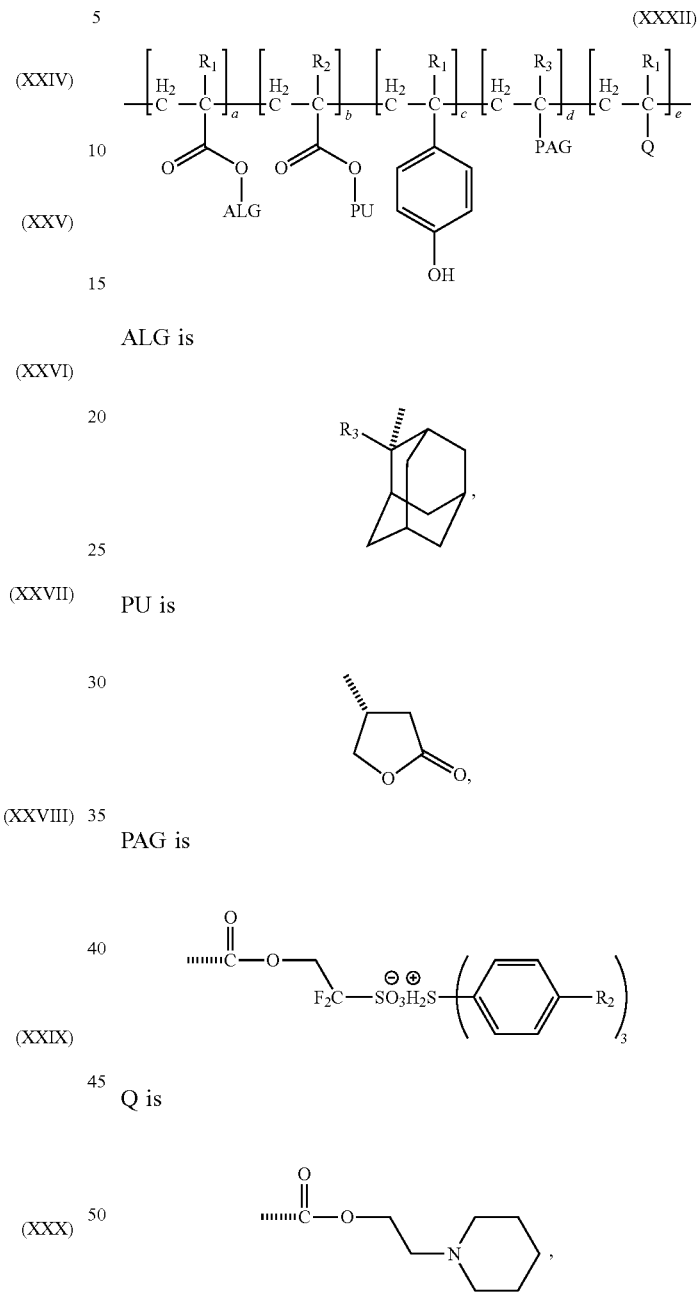

each a, b, c, d, e independently represents a mole ratio of each monomer unit, and a+b+c+d+e=1, a, d or e is independently in a range from 0.01 to about 0.6, b or c is smaller than or equal to 0.3, and b or c can be omitted in some embodiments. In some other embodiments, b or c is independently in a range from 0.01-0.3.

FIGS. 6A-6H show cross-sectional representations of various stages of forming a semiconductor structure, in accordance with some embodiments of the disclosure. Some processes and materials used to form the semiconductor device structure in FIGS. 6A-6H are similar to, or the same as, those used to form the semiconductor device structure FIGS. 1A-1E and are not repeated herein. In FIGS. 6A-6H, a tri-layer photoresist layer 180 is formed over the material layer 104 over the substrate 102. The tri-layer photoresist layer 180 includes a bottom layer 106, a middle layer 108 and a resist layer 110. The tri-layer photoresist layer 180 is used to pattern the underlying material layer and then is removed.

Figure 6A:
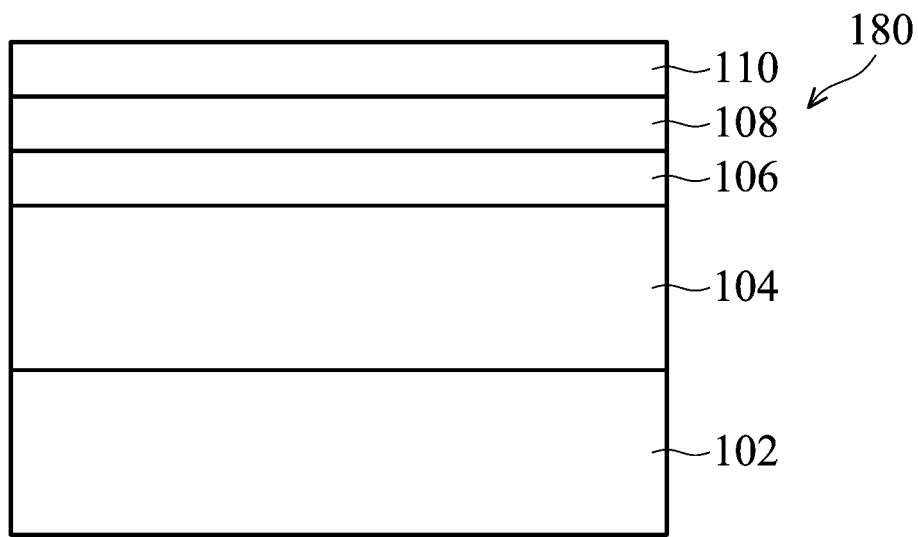
FIGS. 6A-6H show cross-sectional representations of various stages of forming a semiconductor structure, in accordance with some embodiments of the disclosure.

As shown in FIG. 6A, the material layer 104 is formed over the substrate 102. The material layer 104 is configured to be patterned or doped in subsequent manufacturing processes. The material layer 104 may be one or more material layers. In some embodiments, the material layer 104 includes a silicon layer, a dielectric layer, hard mask inorganic layer, metal layer, and/or a doped poly-silicon layer.

Afterwards, the bottom layer 106 is formed over the material layer 104. The bottom layer 106 may be a first layer of a tri-layer resist layer 180 (also referred to as tri-layer photoresist). The bottom layer 106 may contain a material that is patternable and/or have an anti-reflection property. In some embodiments, the bottom layer 106 is a bottom anti-reflective coating (BARC) layer. In some embodiments, the bottom layer 106 includes a carbon backbone polymer. In some embodiments, the bottom layer 106 is made of silicon free material. In some other embodiments, the bottom layer 106 includes novolac resin, such as a chemical structure having multiple phenol units bonded together. In some embodiments, the bottom layer 106 is formed by a spin-on coating process, chemical vapor deposition process (CVD), physical vapor deposition (PVD) process, and/or other suitable deposition processes.

Afterwards, a middle layer 108 is formed over the bottom layer 106, and the resist layer 110 is formed over the middle layer 108. In some embodiments, the bottom layer 106, the middle layer 108 and the resist layer (or the top layer) 110 are called tri-layer photoresist structure. The middle layer 108 may have a composition that provides an anti-reflective property and/or hard mask property for the photolithography process. In addition, the middle layer 108 is designed to provide etching selectivity from the bottom layer 106 and the resist layer 110. In some embodiments, the middle layer 108 is made of silicon, silicon nitride, silicon oxynitride, silicon oxide, tin, tin oxide, titanium, titanium oxide. In some embodiments, the middle layer 108 includes a silicon-containing inorganic polymer. In some embodiments, the resist layer 110 includes a chemical structure as shown in FIGS. 2, 3A-3B, 4A-4E and 5A-5E.

Figure 6B:
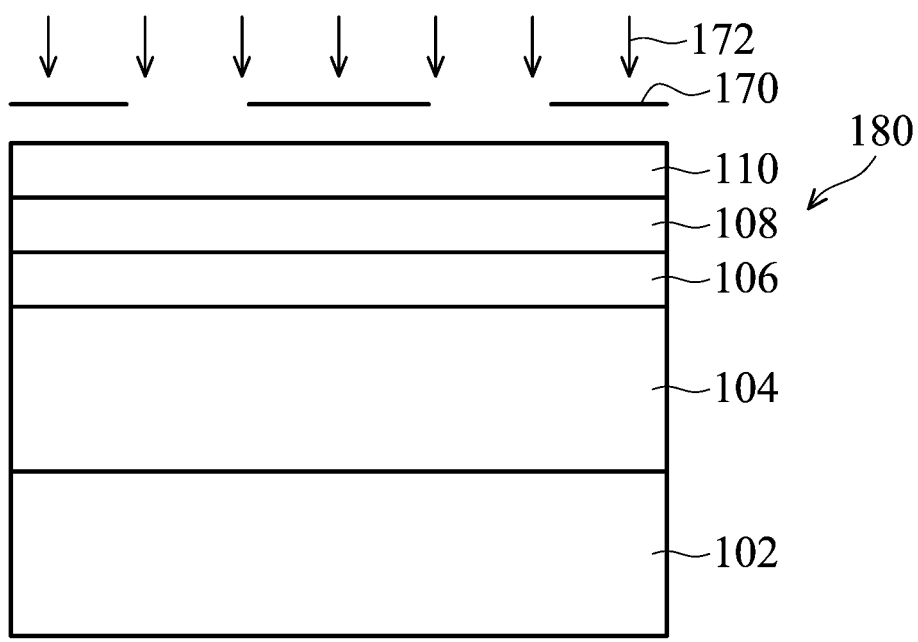

Next, as shown in FIG. 6B, the mask 170 is formed over the resist layer 110, and the exposure process 172 is perform on the resist layer 110, in accordance with some embodiments of the disclosure. After the exposure process 172, the PEB process is performed.

It should be noted that since the resist layer 110 includes a compound having structures as shown in FIGS. 2, 3A-3B, 4A-4E and 5A-5E, the evaporation or the sublimation of the acid and/or base is decreased to prevent the re-deposition of the acid and/or the base on the adjacent patterns. During the PEB process, the acid generated from PAG group 40 and/or the base generated from the quencher (Q) group is not easily evaporated and diffused to the adjacent regions to affect the patterns.

Figure 6C:
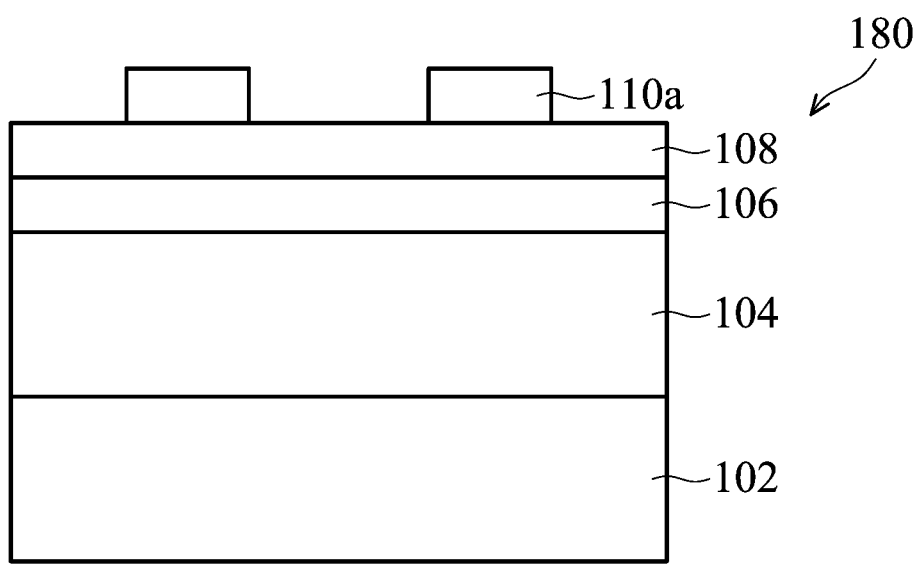

Next, as shown in FIG. 6C, the resist layer 110 is developed by a developer to form the patterned resist layer 110a, in accordance with some embodiments of the disclosure.

Figure 6D:
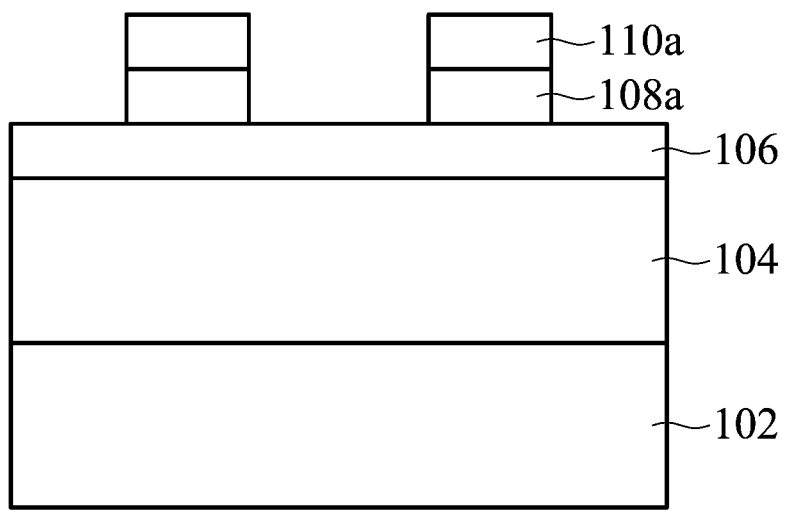

Afterwards, as shown in FIG. 6D, a portion of the middle layer 108 is removed by using the patterned resist layer 110a as a mask to form a patterned middle layer 108a, in accordance with some embodiments of the disclosure. As a result, the pattern of the patterned resist layer 110a is transferred to the middle layer 108.

The portion of the middle layer 108 is removed by a dry etching process, a wet etching process or a combination thereof. In some embodiments, the etching process includes a plasma etching process using an etchant having fluorine, such as $CF_4$, $C_2F_2$, $C_2F_3$, $C_3F_4$, $C_4F_4$, $C_4F_6$, $C_5F_6$, $C_6F_6$, $C_6F_8$ or a combination thereof.

Figure 6E:
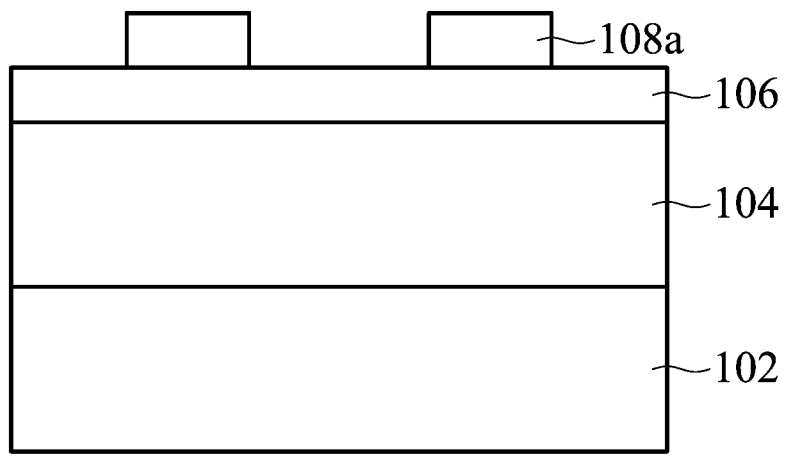

Afterwards, as shown in FIG. 6E, after the middle layer 108 is patterned, the patterned resist layer 110a is substantially removed, in accordance with some embodiments of the disclosure.

Figure 6F:
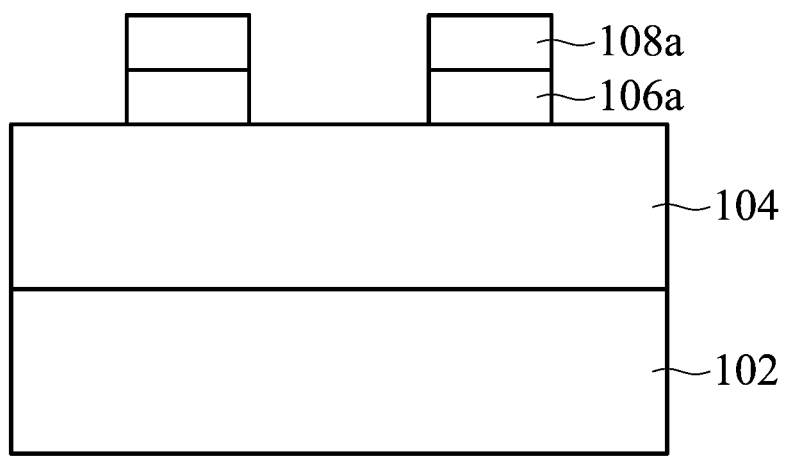

Next, as shown in FIG. 6F, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

Figure 6G:
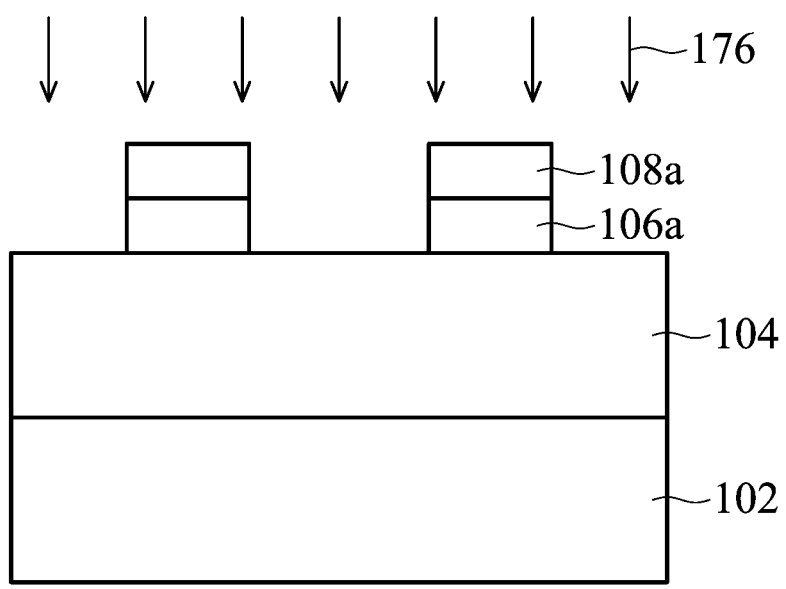

Afterwards, as shown in FIG. 6G, a portion of the material layer 104 is removed by performing an etching process 176 and using the patterned middle layer 108a and the patterned bottom layer 106a as a mask, in accordance with some embodiments of the disclosure. As a result, a patterned material layer 104a is formed.

Figure 6H:
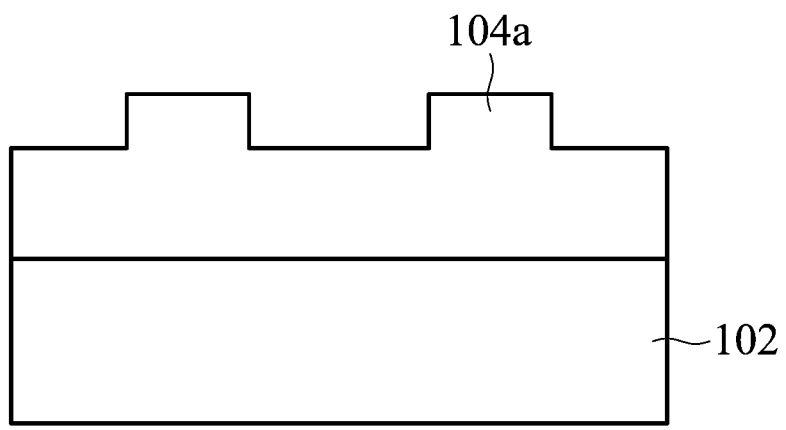

Afterwards, as shown in FIG. 6H, the patterned middle layer 108a and the patterned bottom layer 106a are removed by a dry etching or a wet etching process, in accordance with some embodiments of the disclosure. The wet etching process includes a number of etching processes.

As mentioned above, some small molecules, such as acid generated from PAG, will volatilize and re-deposit on the exposed region to affect the patterns of the exposed region. Therefore, the line width control or critical dimension (CD) control of the pattern is improved. Since the PAG group 40 or the quencher (Q) group 50 are bonded to the carbon backbone to form the structures as shown in FIGS. 2, 3A-3B, 4A-4E and 5A-5E, the chemical flare phenomenon is reduced and/or prevented. Furthermore, the line critical dimension uniformity (LCDU) is improved.

The PEB process includes using the microwave or the IR lamping heating process. It should be noted that since the microwave or the IR lamping heating process can provide the heat uniformly, the resist layer 110 is baked at a certain temperature uniformly by using the microwave or the IR lamping heating process. The chemical reaction can react quickly by providing heat uniformly. As a result, the heating time of the baking process may be reduced to be shorter than 30 seconds.

Embodiments for forming a semiconductor device structure are provided. A material layer is formed over a substrate, and a resist layer is formed over the material layer. The resist layer is patterned by performing an exposure process, a baking process and an etching process. The resist layer includes a linker, at least one of photoacid generator (PAG) group and a quencher (Q) group bonded to the linker. In some other embodiments, at least one of photoacid generator (PAG) group and a quencher (Q) group is bonded to a polymer backbone. Since the photoacid generator (PAG) group and/or the quencher (Q) group are bonded to the carbon backbone, the molecular weight of the photoacid generator (PAG) group or the quencher (Q) group is increased, and therefore the acid and base are not easily evaporated or sublimated. Therefore, the chemical flare phenomenon is avoided. Therefore, the critical dimension uniformity (CDU) of the semiconductor structure is improved.

In some embodiments, a method for forming a semiconductor structure is provided. The method includes forming a material layer over a substrate and forming a resist layer over the material layer. The method includes exposing a portion of the resist layer by performing an exposure process. The resist layer includes a compound, and the compound has a linker, and at least one of a photoacid generator (PAG) group and a quencher group bonded to the linker. The method also includes performing a baking process on the resist layer and etching a portion of the resist layer to form a patterned resist layer. The method includes patterning the material layer by using the patterned resist layer as a mask and removing the patterned resist layer.

In some embodiments, a method for forming a semiconductor structure is provided. The method includes forming a bottom layer over a substrate and forming a middle layer over the bottom layer. The method includes forming a resist layer over the middle layer. The resist layer includes a first polymer, and the first polymer includes a first polymer backbone, and at least one of a photoacid generator (PAG) group and a quencher group are bonded to the first polymer backbone. The method also includes patterning the resist layer to form a patterned resist layer and patterning the middle layer by using the patterned resist layer as a mask to form a patterned middle layer. The method includes removing the patterned resist layer by performing a wet etching process. The wet etching process includes a base solution. The method includes patterning the bottom layer by using the patterned middle layer as a mask to form a patterned bottom layer.

In some embodiments, a method for forming a semiconductor structure is provided. The method includes forming a material layer over a substrate and forming a bottom layer over the material layer. The method includes forming a middle layer over the bottom layer and forming a resist layer over the middle layer. The resist layer includes a first polymer, and the first polymer has a first carbon backbone; and a photoacid generator (PAG) group and a quencher group are bonded to the first carbon backbone. The method includes exposing a portion of the resist layer to form an exposed region and an unexposed region by performing an exposure process and performing a post-exposure-baking (PEB) process on the resist layer. The method also includes etching a portion of the resist layer to form a patterned resist layer and removing a portion of the middle layer by using the patterned resist layer as a mask to form a patterned middle layer. The method further includes removing a portion of the bottom layer by using the patterned middle layer as a mask to form a patterned bottom layer and performing an etching process or an ion implantation process on the material layer by using the patterned bottom layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a material layer over a substrate;
   forming a resist layer over the material layer;
   exposing a portion of the resist layer by performing an exposure process, wherein the resist layer comprises a compound and a polymer, and the compound has a linker, at least one of a photoacid generator (PAG) group and a quencher group bonded to the linker, and the polymer has an acid-labile group (ALG) and a polar unit (PU) bonded to a polymer backbone of the polymer;
   performing a baking process on the resist layer;
   etching a portion of the resist layer to form a patterned resist layer;
   patterning the material layer by using the patterned resist layer as a mask; and
   removing the patterned resist layer.

2. The method for forming the semiconductor structure as claimed in claim 1, wherein a total of the PAG group and the quencher group of the resist layer has a loss in a range from 0.1% to 10% after performing the baking process on the resist layer.

3. The method for forming the semiconductor structure as claimed in claim 1, wherein the compound is a polymer, and the average molecular weight of the polymer is in a range from 300 to 15000.

4. The method for forming the semiconductor structure as claimed in claim 1, wherein performing the baking process on the resist layer comprises using a microwave or an IR lamping heating process.

5. The method for forming the semiconductor structure as claimed in claim 1, wherein the baking process is performed at a temperature in a range from 90 degrees Celsius to 350 degrees Celsius for a period of time in a range from 500 $\mu$s to 30 s.

6. The method for forming the semiconductor structure as claimed in claim 1, wherein the acid-labile group (ALG) cleaves from the polymer backbone when performing the baking process on the resist layer.

7. The method for forming the semiconductor structure as claimed in claim 1, wherein the linker is a carboxylic acid group or an ether group.

8. A method for forming a semiconductor structure, comprising:
   forming a material layer over a substrate;
   forming a bottom layer over the material layer;
   forming a middle layer over the bottom layer;
   forming a resist layer over the middle layer, wherein the resist layer comprises a first polymer, and the first polymer comprises a first polymer backbone, and at least one of a photoacid generator (PAG) group and a quencher group is bonded to the first polymer backbone;
   patterning the resist layer to form a patterned resist layer;
   patterning the middle layer by using the patterned resist layer as a mask to form a patterned middle layer;
   removing the patterned resist layer by performing a wet etching process, wherein the wet etching process comprises a base solution;
   patterning the bottom layer by using the patterned middle layer as a mask to form a patterned bottom layer; and
   performing an etching process on the material layer by using the patterned bottom layer as a mask.

9. The method for forming the semiconductor structure as claimed in claim 8, wherein the resist layer further comprises a second polymer backbone, wherein the quencher group is bonded to the second polymer backbone when the PAG group is bonded to the first polymer backbone.

10. The method for forming the semiconductor structure as claimed in claim 8, wherein the resist layer further comprises an acid-labile group (ALG) bonded to the first polymer backbone; and a polar unit (PU) bonded to the first polymer backbone.

11. The method for forming the semiconductor structure as claimed in claim 10, wherein patterning the resist layer comprises:
exposing a portion of the resist layer to form an exposed region and an unexposed region by performing an exposure process; and
performing a post-exposure-baking (PEB) process on the resist layer, wherein the acid-labile group (ALG) cleaves from the first polymer backbone when performing the baking process on the resist layer.

12. The method for forming the semiconductor structure as claimed in claim 8, wherein patterning the resist layer comprises:
irradiating the resist layer by Krypton Fluoride (KrF) excimer laser, Argon Fluoride (ArF) excimer laser, Fluoride ($F_2$) Excimer Laser, or Extreme ultra-violet (EUV) light;
performing a post-exposure-baking (PEB) process on the resist layer; and
developing the resist layer to form the patterned resist layer.

13. The method for forming the semiconductor structure as claimed in claim 12, wherein performing the post-exposure-baking (PEB) process comprises using a microwave or an IR lamping heating process.

14. The method for forming the semiconductor structure as claimed in claim 13, wherein the first polymer backbone having the PAG group and/or the quencher group is configured to reduce the evaporation or sublimation of an acid generated from the PAG and/or a base generated from the quencher group after the PEB process, and the loss of the solid content of the resist layer is in a range from 1% to 5% after performing the PEB process on the resist layer.

15. The method for forming the semiconductor structure as claimed in claim 13, wherein the PEB process is performed at a temperature in a range from 90 degrees to 350 degrees for a period of time in a range from 500 □s to 30 s.

16. The method for forming the semiconductor structure as claimed in claim 8, wherein the first polymer has a formula (I),

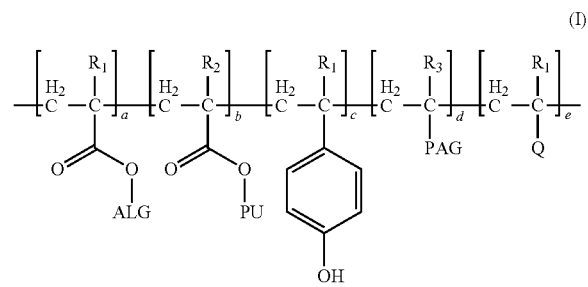

wherein ALG represents an acid-labile group, PU represents a polar unit, PAG represents a photoacid generator, and Q represents a quencher, $R_1$ is hydrogen or methyl ($CH_3$); and each a, b, c, d, e independently represents a mole ratio of each monomer unit, and a+b+c+d+e=1, a, d or e is independently in a range from 0.01 to 0.6, b, c is smaller than or equal to 0.3.

17. A method for forming a semiconductor structure, comprising:
forming a material layer over a substrate;
forming a bottom layer over the material layer;
forming a middle layer over the bottom layer;
forming a resist layer over the middle layer, wherein the resist layer comprises a first polymer, and the first polymer has a first carbon backbone; and a photoacid generator (PAG) group and a quencher group are bonded to the first carbon backbone;
exposing a portion of the resist layer to form an exposed region and an unexposed region by performing an exposure process;
performing a post-exposure-baking (PEB) process on the resist layer;
etching a portion of the resist layer to form a patterned resist layer;
removing a portion of the middle layer by using the patterned resist layer as a mask to form a patterned middle layer;
removing a portion of the bottom layer by using the patterned middle layer as a mask to form a patterned bottom layer; and
performing an etching process on the material layer by using the patterned bottom layer as a mask.

18. The method for forming the semiconductor structure as claimed in claim 17, wherein the resist layer further comprises an acid-labile group (ALG) bonded to the first carbon backbone; and a polar unit (PU) bonded to the first carbon backbone.

19. The method for forming the semiconductor device structure as claimed in claim 17, wherein the resist layer further comprises a second polymer backbone, and an acid-labile group (ALG) and a polar unit (PU) are bonded to the second polymer backbone.

20. The method for forming the semiconductor device structure as claimed in claim 17, wherein the first carbon backbone having the PAG group and the quencher group is configured to reduce the evaporation or sublimation of an acid generated from the PAG and the base generated from the quencher group after the PEB process on the resist layer.

* * * * *